United States Patent
Reynaud et al.

(10) Patent No.: US 8,962,450 B2
(45) Date of Patent: *Feb. 24, 2015

(54) METHOD FOR MANUFACTURING A SEMICONDUCTOR-ON-INSULATOR STRUCTURE HAVING LOW ELECTRICAL LOSSES

(71) Applicant: Soitec, Bernin (FR)

(72) Inventors: Patrick Reynaud, Murianette (FR); Sébastien Kerdiles, Saint-Ismier (FR); Daniel Delprat, Crolles (FR)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/049,263

(22) Filed: Oct. 9, 2013

(65) Prior Publication Data

US 2014/0038388 A1    Feb. 6, 2014

Related U.S. Application Data

(63) Continuation of application No. 13/487,066, filed on Jun. 1, 2012, now Pat. No. 8,658,514, which is a continuation of application No. PCT/EP2010/068883, filed on Dec. 3, 2010.

(30) Foreign Application Priority Data

Dec. 4, 2009    (FR) ...................................... 09 58658

(51) Int. Cl.
*H01L 21/78*    (2006.01)
*H01L 21/762*    (2006.01)

(52) U.S. Cl.
CPC ................................ *H01L 21/76254* (2013.01)
USPC .......................................................... 438/458

(58) Field of Classification Search
CPC ..................... H01L 21/7624; H01L 21/76251; H01L 21/76254; H01L 21/76256; H01L 21/76259; H01L 21/762; H01L 21/78; H01L 21/7806; H01L 21/7813
USPC .......................................... 438/455, 458, 459
See application file for complete search history.

(56) References Cited

U.S. PATENT DOCUMENTS

| | | | |
|---|---|---|---|
| 5,374,564 A | 12/1994 | Bruel | 437/24 |
| 5,492,859 A | 2/1996 | Sakaguchi et al. | 438/459 |

(Continued)

FOREIGN PATENT DOCUMENTS

| | | |
|---|---|---|
| EP | 1 688 990 A2 | 8/2006 |
| EP | 1688990 A2 * | 8/2006 |

(Continued)

OTHER PUBLICATIONS

International Search Report, Appl. No. PCT/EP2010/068883, Mar. 1, 2011.

(Continued)

*Primary Examiner* — Michele Fan
(74) *Attorney, Agent, or Firm* — TraskBritt

(57) ABSTRACT

A manufacturing process for a semiconductor-on-insulator structure having reduced electrical losses and which includes a support substrate made of silicon, an oxide layer and a thin layer of semiconductor material, and a polycrystalline silicon layer interleaved between the support substrate and the oxide layer. The process includes a treatment capable of conferring high resistivity to the support substrate prior to formation of the polycrystalline silicon layer, and then conducting at least one long thermal stabilization on the structure at a temperature not exceeding 950° C. for at least 10 minutes.

16 Claims, 3 Drawing Sheets

(56) References Cited

U.S. PATENT DOCUMENTS

| | | | |
|---|---|---|---|
| 5,561,303 A | 10/1996 | Schrantz et al. | 257/77 |
| 6,171,932 B1 | 1/2001 | Shiota | 438/455 |
| 6,472,711 B1 | 10/2002 | Shiota | 257/347 |
| 7,147,711 B2 | 12/2006 | Tamatsuka et al. | 117/13 |
| 7,902,045 B2 | 3/2011 | Arena et al. | 438/459 |
| 7,964,423 B2 | 6/2011 | Akimoto | 438/39 |
| 2003/0040163 A1 | 2/2003 | Yokokawa et al. | 438/406 |
| 2003/0170990 A1 | 9/2003 | Sakaguchi et al. | 438/690 |
| 2004/0002197 A1 | 1/2004 | Fathimulla et al. | 438/455 |
| 2004/0159908 A1 | 8/2004 | Fathimulla et al. | 257/531 |
| 2004/0259388 A1 | 12/2004 | Schwarzenbach et al. | 438/795 |
| 2005/0042361 A1 | 2/2005 | Tomey et al. | 438/455 |
| 2005/0127477 A1 | 6/2005 | Takase et al. | |
| 2005/0158969 A1 | 7/2005 | Binns et al. | 438/471 |
| 2005/0250349 A1 | 11/2005 | Sadamitsu et al. | 438/800 |
| 2005/0253221 A1 | 11/2005 | Takase et al. | 257/607 |
| 2005/0269671 A1 | 12/2005 | Faure et al. | 257/618 |
| 2006/0024908 A1 | 2/2006 | Neyret et al. | 438/398 |
| 2006/0141748 A1 | 6/2006 | Daval et al. | 438/455 |
| 2006/0166451 A1 | 7/2006 | Raskin et al. | |
| 2007/0032040 A1 | 2/2007 | Lederer | 438/455 |
| 2007/0032042 A1 | 2/2007 | Takayama et al. | 438/458 |
| 2007/0066033 A1 | 3/2007 | Kurita et al. | 438/473 |
| 2007/0080372 A1 | 4/2007 | Faure et al. | 257/201 |
| 2008/0014717 A1 | 1/2008 | Endo et al. | 438/458 |
| 2008/0050887 A1 | 2/2008 | Chen et al. | 438/455 |
| 2008/0303118 A1* | 12/2008 | Arena et al. | 257/615 |
| 2009/0042361 A1 | 2/2009 | Takeno et al. | |
| 2009/0075456 A1 | 3/2009 | Akimoto et al. | 438/458 |
| 2010/0297828 A1 | 11/2010 | Maleville | 438/458 |
| 2010/0314722 A1 | 12/2010 | Ishizuka et al. | 257/627 |

FOREIGN PATENT DOCUMENTS

| | | |
|---|---|---|
| JP | 2004-6615 A | 1/2004 |
| JP | 2005-123351 A | 5/2005 |
| JP | 2007-507093 A | 3/2007 |
| WO | WO 2005/029576 A2 | 3/2005 |
| WO | WO 2009/112306 A1 | 9/2009 |
| WO | WO 2010049496 A1 * | 5/2010 |

OTHER PUBLICATIONS

U.S. Appl. No. 13/487,066, filed Jun. 1, 2012.
U.S. Appl. No. 13/487,066, Restriction Requirement, Feb. 6, 2013.
U.S. Appl. No. 13/487,066, Non-Final Office Action, Apr. 4, 2013.
U.S. Appl. No. 13/487,066, Notice of Allowance, Jul. 26, 2013.

* cited by examiner

METHOD FOR MANUFACTURING A SEMICONDUCTOR-ON-INSULATOR STRUCTURE HAVING LOW ELECTRICAL LOSSES

CROSS-REFERENCE TO RELATED APPLICATIONS

This application is a continuation of U.S. application Ser. No. 13/487,066 filed Jun. 1, 2012, now U.S. Pat. No. 8,658,514, issued Feb. 25, 2014, which is a continuation of International Application No. PCT/EP2010/068883 filed Dec. 3, 2010, which claims priority of French Application No. 0958658 filed Dec. 4, 2009, the entire content of each of which is expressly incorporated herein by reference thereto.

BACKGROUND

The present invention relates to a manufacturing process for a structure of a semiconductor on insulator (SeOI) having reduced electrical losses. It also relates to such a structure.

The invention focuses on the general context of manufacturing a structure of semiconductor on insulator type (SOI) by the SMARTCUT® process. This process is described in detail, for example, in U.S. Pat. No. 5,374,564. A structure of this type generally comprises a support layer, typically made of silicon monocrystalline having high resistivity, an insulating oxide layer, and a thin layer of semiconductor material. This thin layer is designed to take up components, typically electronic components.

In particular, in applications in which use is made of radio-frequencies, for example in the field of radiophony, part of the emitted waves can be absorbed by the support substrate, despite the presence of the insulating layer, resulting in electrical losses. To combat this difficulty, it has been proposed to boost resistivity of the support substrate to over 500 Ω·cm, or even over a few thousand Ohms·cm, though this does not prove to be sufficient. It was then proposed to deposit on the upper face of the support substrate (that is, the one receiving the insulating layer and the thin layer), a layer of material whereof the density of charge-carrier traps is high. A polycrystalline silicon layer is adapted in particular to ensure this function. Its structure is formed by a multitude of crystalline grains having defective boundaries (grain joint) forming traps, which makes the ensemble particularly low-conductive. This reduces leakage currents and losses in resistivity at the level of the support substrate.

The technique to achieve the foregoing structure includes depositing a polycrystalline silicon layer on the support substrate, then applying the usual steps of the SMARTCUT® process. This type of method is described in particular in U.S. patent application No. 2007/0032042. When conducting tests on resulting structures which would exhibit high resistivity according to the teachings of that application, however, it was found that the technique in question did not reduce electrical losses satisfactorily. Thus, there remains a need for different solutions to this problem, and these are now provided by the present invention.

SUMMARY OF THE INVENTION

The present invention now provides a manufacturing process for a semiconductor on insulator type structure having reduced electrical losses, in which the polycrystalline silicon layer which is placed on the support substrate has the expected resistive character.

The process is applied to a substrate successively comprising a support substrate made of silicon, an oxide layer and a thin layer of semiconductor material, and having a polycrystalline silicon layer interleaved between the support substrate and the oxide layer. The process includes oxidizing a donor substrate made of semiconductor material to form an oxide layer on a surface thereof; implanting ions in the donor substrate to form an embrittlement zone therein; bonding the donor and support substrates together with the oxide layer being located therebetween at a bonding interface, the substrate support having a high resistivity that is greater than 500 Ω·cm, and a polycrystalline silicon layer on its upper face which is bonded the donor substrate; fracturing the donor substrate at the embrittlement zone to transfer to the support substrate a thin layer of semiconductor material from the donor substrata and form a SeOI structure; and conducting at least one thermal stabilisation of the SeOI structure, at a temperature not exceeding 950° C., and for a time of at least 10 minutes.

The invention also relates to the structures that are provided by the method. These structures have an average resistivity that is greater than 10,000 Ohms·cm.

BRIEF DESCRIPTION OF THE DRAWING FIGURES

Other characteristics and advantages of the present invention will emerge from the following description of certain preferred embodiments. This description will be given in reference to the attached diagrams, in which.

DETAILED DESCRIPTION OF PARTICULAR EMBODIMENTS OF THE INVENTION

Figure 1:
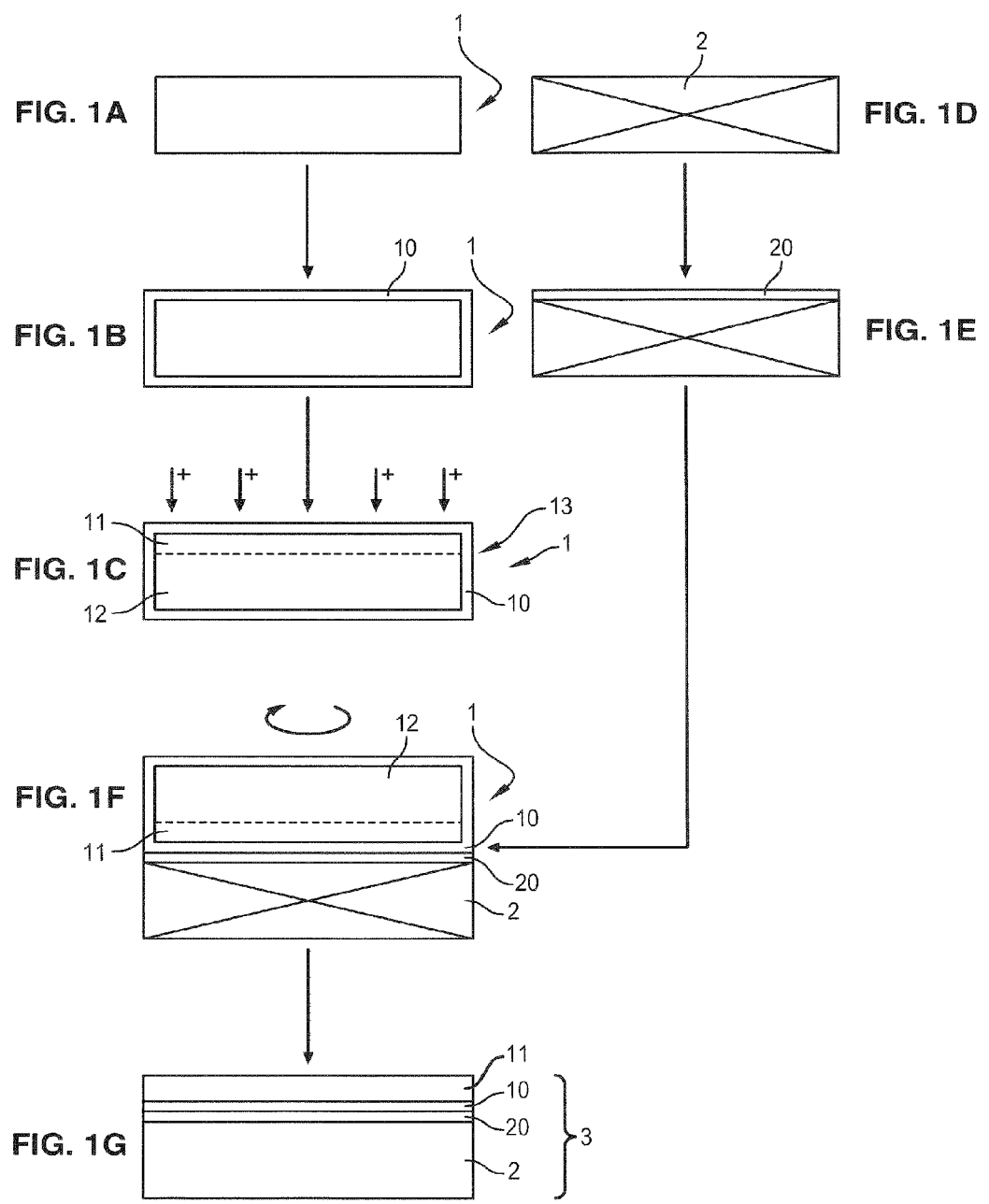
FIGS. 1A to 1G represent the different steps of the process according to the invention.
Figure 2:
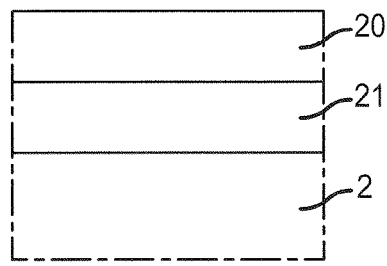
FIG. 2 is a detailed view of part of the structure into which a decoupling layer is interleaved.

The present method is preferably applied to an SOI structure that successively comprises a support substrate made of silicon, an oxide layer and a thin layer of semiconductor material, a polycrystalline silicon layer being interleaved between the support substrate and the oxide layer. The process comprises the following steps:

a) oxidation of a donor substrate made of semiconductor material to form an oxide layer at the surface;

b) implantation of ions in the donor substrate to form an embrittlement zone therein;

c) adhesion of the donor substrate to the support substrate, the oxide layer being located at the adhesion interface, the support substrate having undergone thermal treatment capable of giving it high resistivity, that is, a resistivity greater than 500 Ω·cm, its upper face which receives the donor substrate being coated by the polycrystalline silicon layer;

d) fracture of the donor substrate according to the embrittlement zone to transfer to the support substrate a thin layer of semiconductor material;

e) conducting of at least one stabilisation process of the resulting structure.

This process is remarkable in that the treatment capable of conferring high resistivity to the support substrate is carried out prior to formation of the polycrystalline silicon layer, and in that step e) comprises at least one long thermal step, carried out at a temperature not exceeding 950° C., for at least 10 minutes.

The polycrystalline silicon is thus deposited after treatment capable of giving the support substrate high resistivity, such that high temperatures utilised during this treatment do not affect the polycrystalline character of the polycrystalline silicon layer.

Similarly, thermal budget used during thermal treatment of the final structure is not sufficient to modify this polycrystalline character.

According to other advantageous and non-limiting characteristics:
- the resistivity of the support substrate is greater than 1,000 Ω·cm, preferably greater than 2,000 Ω·cm, still more preferably greater than 3,000 Ω·cm;
- the long thermal step is carried out for several hours;
- it comprises brief treatment conducted for less than 10 minutes, at a temperature greater than 1,000° C., advantageously for one to two minutes, at a temperature of the order of 1,200° C.;
- thermal treatment capable of conferring high resistivity to the support substrate comprises at least one step brought to a temperature of between 500 and 1,200° C., for 30 minutes to 20 hours;
- thermal treatment capable of conferring high resistivity to the support substrate is an annealing treatment in three steps, the second step being brought to a temperature less than that of the other two steps;
- the three steps are carried out respectively at a temperature of between 1,000 and 1,200° C. for 1 to 10 hours, 600 to 900° C. for 1 to 10 hours, and 900 to 1,200° C. for 1 to 48 hours;
- in step e), the stabilisation comprises at least one thermal stabilisation treatment and one thermal thinning treatment of the thin layer;
- in step c), prior to depositing of the polycrystalline silicon layer, a semiconductive decoupling layer of crystalline network, that is, having a mesh parameter different to that of monocrystalline silicon is deposited onto the receiver substrate;
- the decoupling layer contains polycrystalline silicon;
- the decoupling layer also contains silicon-based and another atomic species-based semiconductor material;
- the silicon-based conductive material is SiC or SiGe;
- depositing of the decoupling layer and of the polycrystalline silicon layer is carried out continuously, that is, in the first instance, by simultaneous feed from two gas sources, respectively polycrystalline silicon and the other atomic species, then by feed only from the polycrystalline silicon source;
- a new decoupling layer is also deposited onto the polycrystalline silicon layer;
- at least one stack constituted by a polycrystalline silicon layer and a decoupling layer are then deposited onto the new decoupling layer;

The invention also relates to a structure of semiconductor on insulator type, with reduced electrical losses, which successively comprises a support substrate made of silicon, an oxide layer and a thin layer of semiconductor material, a polycrystalline silicon layer being interleaved between the support substrate and the oxide layer and is remarkable in that the polycrystalline silicon layer has a resistivity greater than 5,000 Ohms·cm.

Preferably, it has an average resistivity greater than 10,000 Ohms·cm, or even greater than 50,000 Ohms·cm.

As pointed out earlier, the process according to the invention is of the SMARTCUT® type.

FIG. 1A accordingly illustrates a donor substrate 1 in silicon (Si), preferably monocrystalline, covered by a layer 10 of silicon dioxide (SiO$_2$). This corresponds to FIG. 1B.

This oxide layer can result from thermal oxidation of the donor substrate 1 or has been formed by conventionally depositing by chemical depositing techniques in a vapor phase well known to the person skilled in the art under the abbreviations CVD and LPCVD (for "Chemical Vapor Deposition" and "Low Pressure Chemical Vapor Deposition").

With reference to FIG. 1C, the donor substrate is subjected to implantation of atomic or ionic species via an oxide layer 2.

"Implantation of atomic or ionic species" is understood as any bombardment of these species capable of introducing them to the donor substrate with maximal concentration to a predetermined depth of the substrate relative to the bombarded surface, with a view to creating an embrittlement zone 13. This type of implantation is done according to the process known by the name SMARTCUT®.

The embrittlement zone 13 delimits a thin layer 11 from the rest 12 of the donor substrate 1.

The implantation of atomic or ionic species can be simple implantation, that is, implantation of a single atomic species such as for example implantation of hydrogen, helium or noble gas.

Implantation can also be co-implantation of atomic or ionic species, such as helium and hydrogen.

A receiver substrate 2 is illustrated in FIG. 1D, and is a solid substrate made of silicon.

A characteristic of this support substrate is having undergone thermal treatment capable of giving it an other resistivity, that is, a resistivity greater than 500 Ω·cm, or even greater than 1,000, preferably still greater than 2,000, or even still more preferably greater than 3,000 Ω·cm.

This treatment can have been carried out since fabrication of the substrate or later on, within the scope of the present process.

This thermal treatment capable of giving the support substrate 2 high resistivity is a thermal treatment for example, comprising at least one step brought to a temperature of between 500 and 1,200° C. for 30 minutes to 20 hours.

In another embodiment, this treatment comprises annealing treatment in three steps, the second step being brought to a temperature less than that of the other two steps.

Advantageously, these three steps are carried out respectively at a temperature of between 1,000 and 1,200° C. for 1 to 10 hours, 600 to 900° C. for 1 to 10 hours and 900 to 1,200° C. for 1 to 48 hours.

The function of the first step of this advantageous and optional treatment, also known as "high-low-high treatment", is to remove oxygen from a superficial zone of the substrate, by a phenomenon known as "exodiffusion" to produce denuded zone, that is, a zone without oxygen precipitates. This is therefore a zone having fewer defects than at the outset, an advantage for subsequent depositing of polysilicon.

The aim of the second step of this process is to enable nucleation, that is, the creation of "embryos" of interstitial oxygen precipitates.

Finally, the function of the third step of this process is to enable growth of precipitates created in the preceding step, that is, constitute oxide clusters. This translates via an increase in resistivity of the material.

In any case, this augmentation treatment of the resistivity of the substrate 2 is carried out prior to depositing, on the latter, of a polycrystalline silicon layer 20.

Proceeding with this effectively retains the polycrystalline structure of the layer 20.

After the donor substrate 1 is reversed, it is then put in contact with the layer 20 of the support substrate 8, such that the oxide layer 10 regains contact with the polysilicon layer 20.

Adhesion between the two substrates is completed in a preferred but non-obligatory manner, by molecular adhesion.

Disbonding annealing is carried out, followed by detachment from the rest 12 of the donor substrate 1, at the level of the embrittlement zone 13, so as to transfer the layer 11 to the support substrate 2, more precisely on the polysilicon layer 20.

This produces a substrate 3 of semiconductor on insulator type which is in semi-finished state.

Stabilisation of the resulting structure 3 is then carried out.

In keeping with the invention, this stabilisation comprises a long thermal step, carried out at a temperature not exceeding 950° C. for at least 10 minutes, and optionally a brief treatment carried out for less than 10 minutes at a temperature greater than 1,000° C.

The long thermal step is preferably carried out for several hours, whereas the brief treatment is carried out for 1 to 2 minutes at a temperature of the order of 1,200° C.

More precisely, these finishing steps comprise at least one of the following treatments:

a) thermal stabilisation treatment before polishing, consuming the zone of the donor substrate damaged by separation at the level of the interface 13;

b) mechanical and chemical polishing treatment (CMP) for consuming the material of the layer 11 to arrive at the preferred thickness;

c) final thermal thinning treatment to attain the final preferred thickness.

In respecting the temperature and duration conditions indicated earlier, thermal budgets carried out are inadequate for recrystallized polysilicon, which loses its beneficial effects.

But, limiting the duration and/or temperature of the treatments during stabilisation of the structure causes embrittlement of the interface created such that it is highly useful to carry out intermediate treatments for reinforcing cohesion of the structure. A particular treatment is carried out prior to adhesion using plasma.

In accordance with a preferred embodiment of the process according to the invention, the polycrystalline silicon layer is formed on a layer 21 known as "network crystalline decoupling," that is, a layer having a concentration gradient with a mesh parameter different to that of silicon formed by the support substrate.

This difference in mesh parameter is for example greater than 5%.

This decoupling layer advantageously contains polycrystalline silicon, but in no case pure monocrystalline silicon.

According to a preferred embodiment, it also contains a silicon-based and another atomic species-based semiconductor material.

This can be SiC or SiGe for example.

The advantage of this gradient layer between the support substrate 2 and the polysilicon layer is that it prevents the polysilicon from recrystallising from the layer 11.

This gradient layer opposes recrystallisation of polysilicon. Via its cavities and grain joints, the polysilicon layer:

traps the contaminants generating a drop in resistivity (B, P, Ca, Na, etc.);

forms a barrier to electrical charges contained under the oxide 10;

prevents diffusion of interstitial oxygen contained in the oxide 10 (diffusion causing poor trapping, such as a "gettering" effect).

The decoupling layer 21 as well as the polysilicon layer 20 are preferably manufactured in the same depositing step, continuously, meaning that the decoupling layer 21 is first formed by injecting a first gas to constitute polysilicon and a second gas to constitute the other atomic species; then, once the preferred thickness is attained the arrival of the second gas is cut off by continued injecting of the gas to form the polysilicon layer 20.

Figure 3:
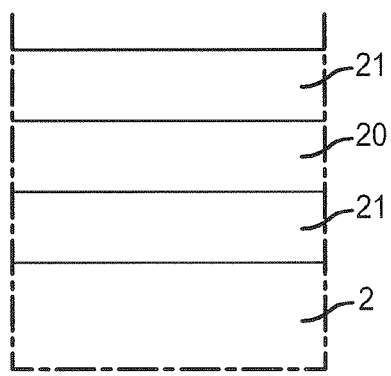
FIG. 3 is a variant of FIG. 2 in which an additional decoupling layer is formed on the polycrystalline silicon.

As shown in FIG. 3, a new decoupling polysilicon layer can also be constituted, which prevents the latter from recrystallising from the thin layer of semiconductor material 11.

Optionally, a stack comprising decoupling layer 21/polysilicon layer 20/decoupling layer 21/polysilicon layer 20, etc., can be formed.

Advantageously, the total thickness of the polysilicon layer and of the decoupling layer or decoupling layers is between 3,000 and 10,000 Å, with a ratio 10 between the thickness of the polysilicon layer and the decoupling layer.

Figure 4:
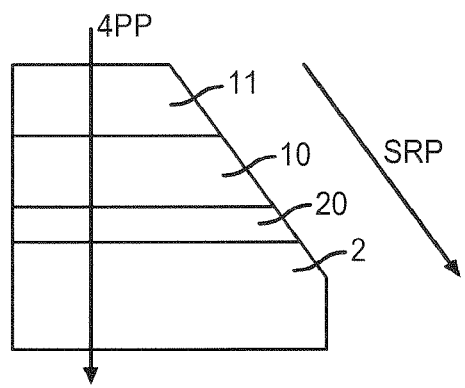
FIG. 4 is a sectional view of a structure according to the invention whereof the resistivity is proposed to be tested.

FIG. 4 proposes testing the resistivity of a structure obtained according to the invention.

This characterisation is done by means of the well-known method called "4PP" (for "four points probe"), specifically by using 4 electrodes passing through the entire structure.

A second method known as "SRP," also well known, traces the evolution of resistivity as a function of the depth, by means of a mitre, as shown by the abovementioned FIG. 3.

Irrespective of the method used, it is evident that the structure treated according to the process according to the invention retains high resistivity, compared to the same structure which would not have undergone the process according to the invention.

Using the method known as 4PP and by conducting comparative tests, average resistivity rises from 4 to 5,000 Ω·cm to over 70,000 Ω·cm.

Figure 5A:
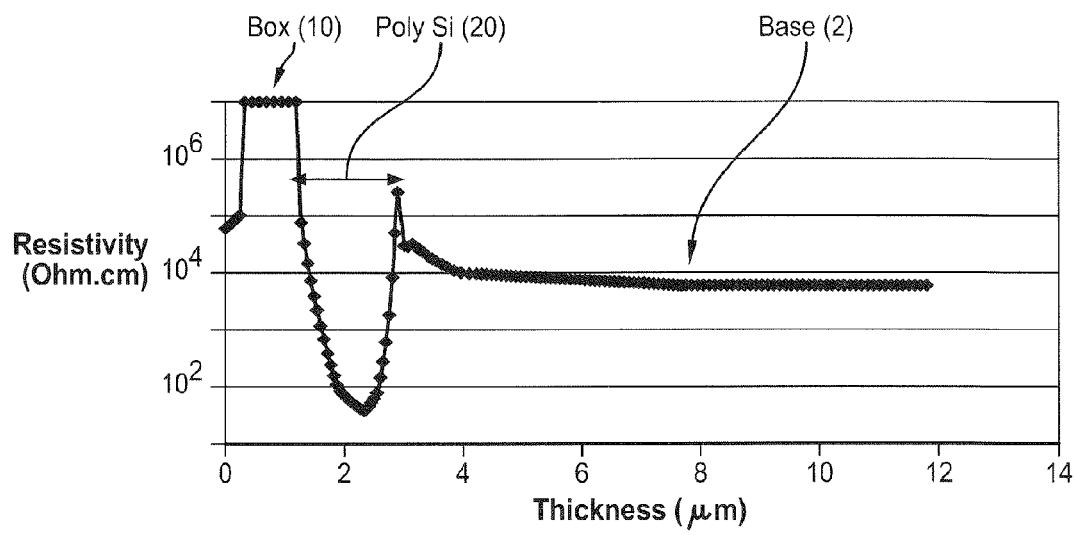
FIGS. 5A and 5B are graphics respectively illustrating according to the prior art and according to the invention resistivity measured via a structure such as that of FIG. 4, utilising the "SRP" method.
Figure 5B:
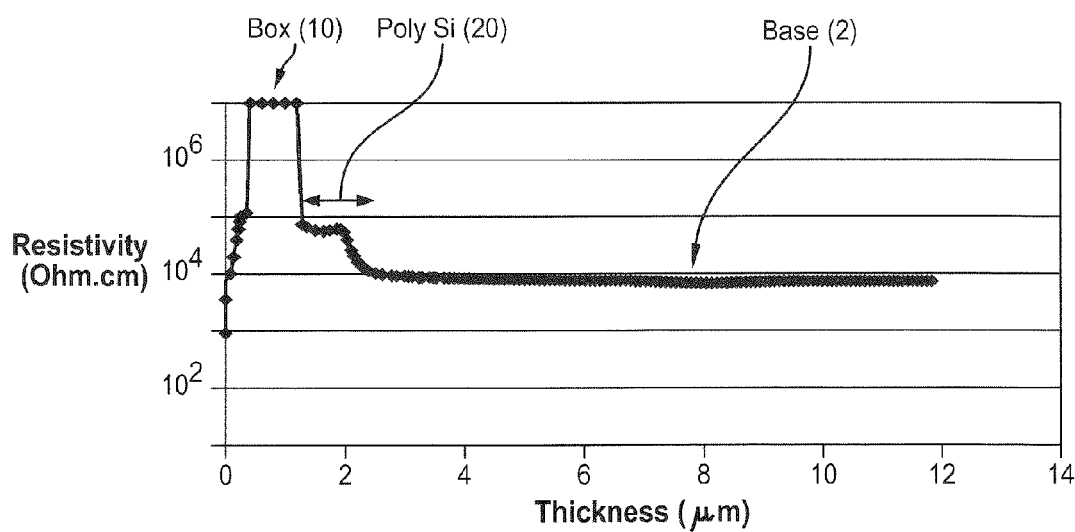

Furthermore, and as shown in FIGS. 5A and 5B, the method known as "SRP" tested on a structure according to the prior art cited at the outset of the description (FIG. 5A), comparatively to the invention (FIG. 5B), shows that according to the invention the polysilicon layer has very high resistivity, contrary to the structure according to the prior art.

This is due to the fact that the polysilicon has retained its polycrystalline structure.

Finally, tests were conducted by "injecting" an electrical signal in a component.

The power of harmonics as a function of the principal signal is then measured.

When components used in the field of radio-frequencies are operating, parasite signals can be generated by the electrical signals that pass through them at different frequencies. These are known as harmonic waves.

In the case of a glass substrate, almost no harmonic is generated, and the more the substrate on which the component electronic is made high-performing, the less is the power of the harmonics.

In the case of a support substrate 2 made of high-resistivity silicon, without the presence of a polycrystalline silicon layer under the Box, the harmonics are high.

With the presence of such a layer, though without modifying thermal treatments, electrical performance is improved, but thermal budget causes partial recrystallization or even total recrystallization of the poly-Si and eliminates significant electrical traps.

Finally, the presence of polycrystalline silicon under the Box considerably improves electrical performance, since the manufacturing process is applied according to the invention and/or a decoupling layer 21 is introduced which prevents recrystallization of the silicon.

It is evident, finally, that depositing a gradient layer between the support substrate and the polycrystalline silicon can also be carried out within the scope of manufacturing a structure of SOI type, other than by the SMARTCUT® technique.

What is claimed is:

1. A manufacturing process for preparing a semiconductor on insulator (SeOI) structure that exhibits type-reduced electrical losses, the substrate successively comprising a support substrate made of silicon, an oxide layer and a thin layer of semiconductor material, and having a polycrystalline silicon layer interleaved between the support substrate and the oxide layer, which process comprises:
    oxidizing a donor substrate made of semiconductor material to form an oxide layer on a surface thereof;
    implanting ions in the donor substrate to form an embrittlement zone therein;
    depositing a semiconductive decoupling layer on a support substrate, the semiconductive decoupling layer having a mesh parameter different from a mesh parameter of the support substrate;
    after depositing the semiconductive decoupling layer, depositing a polycrystalline silicon layer on the semiconductive decoupling layer;
    bonding the donor substrate and the support substrate together with the oxide layer being located therebetween at a bonding interface, the support substrate having a high resistivity that is greater than 500 Ω·cm, and the polycrystalline silicon layer on an upper face of the support substrate which is bonded to the donor substrate;
    fracturing the donor substrate at the embrittlement zone to transfer to the support substrate the thin layer of semiconductor material from the donor substrate and form the SeOI structure; and
    conducting at least one thermal stabilization of the SeOI structure, at a temperature not exceeding 950° C., and for a time of at least 10 minutes.

2. The process of claim 1, wherein the resistivity of the support substrate is greater than 1,000 Ω·cm and is obtained by a thermal treatment carried out prior to the deposition of the polycrystalline silicon layer thereon.

3. The process of claim 2, wherein the thermal treatment comprises heating to a temperature of between 500 and 1,200° C. for 30 minutes to 20 hours.

4. The process of claim 2, wherein the thermal treatment is an annealing treatment conducted over multiple steps, with the steps including heating to different temperatures.

5. The process of claim 4, wherein the multiple steps comprise three steps conducted respectively at three different temperatures.

6. The process of claim 1, wherein the at least one thermal stabilization is carried out for several hours.

7. The process of claim 1, further comprising a rapid thermal treatment carried out over a period of less than 10 minutes and at a temperature greater than 1,000° C.

8. The process of claim 1, wherein the thermal stabilization comprises at least one thermal stabilization treatment and one thermal thinning treatment of the thin layer.

9. The process of claim 1, wherein the decoupling layer contains comprises polycrystalline silicon.

10. The process of claim 9, wherein the semiconductive decoupling layer also contains another atomic species-based semiconductor material.

11. The process of claim 10, wherein the depositing of the semiconductive decoupling layer and the depositing of the polycrystalline silicon layer are carried out continuously, by a simultaneous feed from at least two gas sources, one of which is a source for polycrystalline silicon and the other of which is a source for the other atomic species, then by feed only from the source for polycrystalline silicon.

12. The process of claim 1, wherein the semiconductive decoupling layer is SiC or SiGe.

13. The process of claim 1, which further comprises depositing a further decoupling layer on the polycrystalline silicon layer.

14. The process of claim 13, further comprising depositing at least one stack constituted by a polycrystalline silicon layer and a decoupling layer on the further decoupling layer.

15. The process of claim 1, wherein the support substrate has a resistivity that is greater than 1,000 Ω·cm and the polycrystalline silicon layer has a resistivity that is greater than 10,000 Ohms·cm.

16. The process of claim 1, wherein the semiconductive decoupling layer contains polycrystalline silicon and another atomic species-based semiconductor material.

* * * * *

UNITED STATES PATENT AND TRADEMARK OFFICE
CERTIFICATE OF CORRECTION

PATENT NO. : 8,962,450 B2  
APPLICATION NO. : 14/049263  
DATED : February 24, 2015  
INVENTOR(S) : Patrick Reynaud, Sébastien Kerdiles and Daniel Delprat Page 1 of 1

It is certified that error appears in the above-identified patent and that said Letters Patent is hereby corrected as shown below:

In the claims:
CLAIM 9, COLUMN 8, LINE 20, change "contains comprises" to --comprises--

Signed and Sealed this
Twentieth Day of October, 2015

Michelle K. Lee
*Director of the United States Patent and Trademark Office*